United States Patent
Buchanan

(10) Patent No.: US 10,026,474 B2
(45) Date of Patent: Jul. 17, 2018

(54) SWITCHED MEMRISTOR ANALOG TUNING

(71) Applicant: Hewlett Packard Enterprise Development LP, Houston, TX (US)

(72) Inventor: Brent Buchanan, Palo Alto, CA (US)

(73) Assignee: Hewlett Packard Enterprise Development LP, Houston, TX (US)

( * ) Notice: Subject to any disclaimer, the term of this patent is extended or adjusted under 35 U.S.C. 154(b) by 0 days.

(21) Appl. No.: 15/116,105

(22) PCT Filed: Apr. 26, 2014

(86) PCT No.: PCT/US2014/035585
§ 371 (c)(1),
(2) Date: Aug. 2, 2016

(87) PCT Pub. No.: WO2015/163927
PCT Pub. Date: Oct. 29, 2015

(65) Prior Publication Data
US 2017/0148513 A1    May 25, 2017

(51) Int. Cl.
*G11C 13/00* (2006.01)
*H01L 27/24* (2006.01)
*H01L 45/00* (2006.01)

(52) U.S. Cl.
CPC ...... *G11C 13/0021* (2013.01); *G11C 13/0007* (2013.01); *H01L 27/2436* (2013.01); *H01L 27/2463* (2013.01); *H01L 45/08* (2013.01); *H01L 45/1233* (2013.01); *H01L 45/142* (2013.01); *H01L 45/144* (2013.01); *H01L 45/145* (2013.01); *H01L 45/146* (2013.01); *H01L 45/147* (2013.01); *G11C 2213/31* (2013.01); *G11C 2213/32* (2013.01); *G11C 2213/34* (2013.01); *G11C 2213/79* (2013.01)

(58) Field of Classification Search
CPC .......................... G11C 11/15; G11C 13/0021
USPC ........................................................ 365/148
See application file for complete search history.

(56) References Cited

U.S. PATENT DOCUMENTS

| | | | |
|---|---|---|---|
| 7,443,711 B1 | 10/2008 | Stewart et al. | |
| 7,710,679 B1 * | 5/2010 | Sutardja | G11B 20/10009 360/39 |
| 7,750,716 B2 | 7/2010 | Hosoya | |
| 8,812,418 B2 * | 8/2014 | Snider | G06N 3/063 706/27 |
| 8,848,337 B2 * | 9/2014 | Keane | H01C 13/00 361/437 |
| 8,971,423 B1 * | 3/2015 | Fu | H04K 1/10 327/20 |

(Continued)

OTHER PUBLICATIONS

International Searching Authority, The International Search Report and the Written Opinion, dated Apr. 13, 2015, 11 Pgs.

(Continued)

*Primary Examiner* — Son Mai
(74) *Attorney, Agent, or Firm* — North Shore Associates

(57) ABSTRACT

Switched memristor analog tuning employs a switch-selectable programmed resistance to tune a resistance-tunable analog circuit. A plurality of switched memristors is to provide the switch-selectable programmed resistance. The resistance-tunable analog circuit is connected to the plurality of switched memristors. The switch-selectable programmed resistance is to tune an analog attribute of the resistance-tunable analog circuit.

13 Claims, 6 Drawing Sheets

(56) References Cited

U.S. PATENT DOCUMENTS

| | | | | |
|---|---|---|---|---|
| 9,013,177 | B2* | 4/2015 | Strachan | G06K 7/0008 324/207.16 |
| 9,117,749 | B1* | 8/2015 | Or-Bach | H01L 27/2436 |
| 2001/0033196 | A1* | 10/2001 | Lennous | H03H 11/24 327/552 |
| 2006/0031689 | A1* | 2/2006 | Yang | G06F 1/26 713/300 |
| 2009/0067229 | A1* | 3/2009 | Kang | G11C 8/06 365/163 |
| 2011/0182104 | A1* | 7/2011 | Kim | G11C 11/5685 365/148 |
| 2012/0105143 | A1* | 5/2012 | Strachan | G06K 7/0008 327/553 |
| 2012/0194967 | A1 | 8/2012 | Keane et al. | |
| 2013/0044534 | A1 | 2/2013 | Kawai et al. | |
| 2013/0100726 | A1 | 4/2013 | Yi et al. | |
| 2013/0215669 | A1 | 8/2013 | Haukness | |
| 2014/0028347 | A1 | 1/2014 | Robinett et al. | |

OTHER PUBLICATIONS

Xiao-Bo, Tian et al., "The design and simulation of a titanium oxide memristor-based programmable analog filter in a simulation program with integrated circuit emphasis." Chinese Physics B 22.8 (2013): 088501-1, 10 Pgs.

* cited by examiner

SWITCHED MEMRISTOR ANALOG TUNING

CROSS-REFERENCE TO RELATED APPLICATIONS

N/A

STATEMENT REGARDING FEDERALLY SPONSORED RESEARCH OR DEVELOPMENT

N/A

BACKGROUND

A memristor or 'memory resistor,' sometimes also referred to as 'resistive random access memory' (RRAM or ReRAM), is a non-linear, passive, two-terminal electrical device having or exhibiting an instantaneous resistance level or state that is substantially a function of bias history. In particular, a bias (e.g., a voltage or a current) applied across terminals of the memristor may be used to set, select or program a resistance of the memristor. Once programmed, the memristor may retain the programmed resistance for a specified period of time after the bias is removed (e.g., until reprogrammed). As such, a memristor is a two-terminal device that may function as a non-volatile memory where the programmed resistance is stored without the application of power to the memristor.

BRIEF DESCRIPTION OF THE DRAWINGS

Various features of examples in accordance with the principles described herein may be more readily understood with reference to the following detailed description taken in conjunction with the accompanying drawings, where like reference numerals designate like structural elements, and in which.

Certain examples have other features that are one of in addition to and in lieu of the features illustrated in the above-referenced figures. These and other features are detailed below with reference to the above-referenced figures.

DETAILED DESCRIPTION

Examples in accordance with the principles described herein provide analog tuning using a memristor-based, switch-selectable programmed resistance. In particular, a memristor-based, switch-selectable programmed resistance provides an analog resistance that may be varied. Both memristor programming and switch selection among the programmed memristors may be used to vary the analog resistance, for example. In turn, the variable analog resistance may be used to tune an analog device or system. As such, the switch-selectable programmed analog resistance may facilitate rapid or high-speed analog tuning by switch selection among a plurality of available resistance values or levels. In addition, the available analog resistance values may be adjusted or changed by programming resistance values of the memristors to extend a tuning range and capability of the analog tuning. Applications of the analog tuning provided by examples consistent with the principles described herein include, but are not limited to, fast-timed or fast reconfigurable filters, oscillators and amplifiers, each of which employ memristors that are switched or switch selectable to provide analog tuning, for example.

Figure 1:
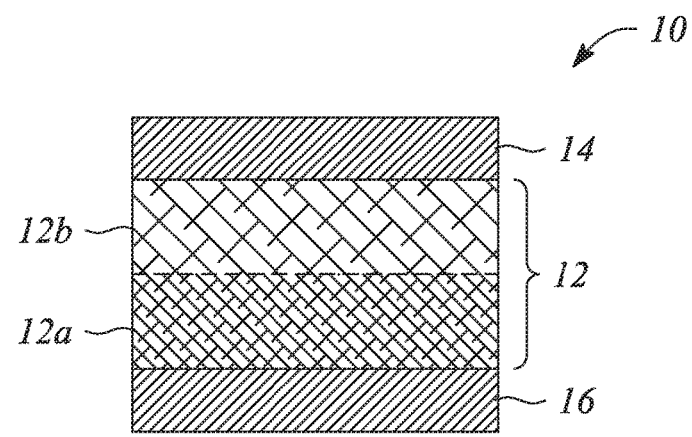
FIG. 1 illustrates a cross sectional view of a memristor, according to an example consistent with the principles described herein.

FIG. 1 illustrates a cross sectional view of a memristor 10, according to an example consistent with the principles described herein. The memristor 10, as illustrated, is a two terminal device including a layer 12 of a memristor switching material, also referred to as a memristor matrix or switching matrix of the memristor 10. By definition herein, the 'memristor switching material' is a material that exhibits a switching phenomenon or characteristic when subjected to a stimulus (e.g., a voltage or a current). The memristor matrix layer 12 is disposed or 'sandwiched' between a first or 'top' electrode 14 and a second or 'bottom' electrode 16. The first and second electrodes 14, 16 facilitate applying a stimulus or 'programming signal' to affect a change in the memristor matrix layer 12. According to some examples, one or both of the first electrode 14 and the second electrode 16 may also participate in the switching phenomenon of the memristor matrix (e.g., as a donor or acceptor of a dopant).

In various examples, the memristor matrix layer 12 of the memristor 10 may include any of a variety of oxides, nitrides and even sulfides that can be formed into a layer between a pair of electrodes. For example, titanium oxide ($TiO_2$) may be used as the oxide layer in a memristor. Other oxides that may be employed include, but are not limited to, hafnium oxide, nickel oxide, nickel oxide doped with chromium, strontium titanate, chromium doped strontium titanate, tantalum oxide, niobium, and tungsten oxide, for example. Nitrides used as a nitride layer of a memristor include, but are not limited to, aluminum nitride and silicon nitride. In addition, other compounds including, but not limited to, antimony telluride, antimony germanium telluride and silver-doped amorphous silicon may be employed, for example.

In some examples, the memristor matrix layer 12 may include a crystalline oxide (e.g., an oxide layer). In other examples, the memristor matrix layer 12 may include a crystalline nitride (e.g., a nitride layer). In some of these examples, the crystalline oxide or nitride may be monocrystalline. In other examples, the memristor matrix layer 12 includes an amorphous oxide or nitride. In yet other examples, the memristor matrix layer 12 includes either a nanocrystalline oxide or nitride or a microcrystalline oxide or nitride. A nanocrystalline oxide or nitride is an oxide or nitride that includes a plurality of nanoscale crystallites while a microcrystalline oxide or nitride may include crystallites having sizes in the micron range, for example.

In some examples, the memristor matrix layer 12 may include a plurality of layers. A first layer of the plurality may be a stoichiometric oxide (e.g., $TiO_2$, $HfO_2$, etc.) while a second layer may be an oxygen depleted or oxygen deficient oxide layer (e.g., $TiO_{2-x}$, $HfO_{2-x}$, etc.) where '2-x' denotes an oxygen deficiency, and where x is greater than 0 and less than about 2). For example, the oxygen deficient $TiO_{2-x}$ may have values of x that are greater than about $10^{-5}$ and less than about $10^{-2}$. In another example, the oxygen deficient $TiO_{2-x}$ may have a value of x that ranges up to about 1.0. Similarly, a first layer of the plurality of layers of the memristor matrix layer 12 may be a stoichiometric nitride (e.g., AlN, $Si_3N_4$, etc.) while a second layer may be a nitrogen depleted or nitrogen deficient nitride layer (e.g., $AlN_{1-y}$, $Si_3N_{4-y}$, etc.). In some examples, these oxygen deficient or nitrogen deficient layers may be referred to as 'suboxides' or 'subnitrides', respectively.

According to some examples, the change in the memristor matrix layer 12 produced by the programming signal may be understood in terms of oxygen (or nitrogen) migration within the memristor matrix layer 12. For example, a boundary between a layer of memristor matrix material 12b that is deficient in oxygen/nitrogen (e.g., the suboxide/subnitride layer) and another effectively stoichiometric memristor matrix material layer 12a (i.e., oxide/nitride that is not oxygen/nitride deficient) may move as a result of exposure to the programming signal. The movement of the boundary may result from oxygen or nitrogen migration under the influence of the programming signal, for example. A final location of the movable boundary may establish the 'programmed' resistance of the memristor 10, according to some examples.

Alternatively, the change in the memristor matrix layer 12 may also be understood in terms of a formation of current filaments, according to some examples. In either case, a conduction channel may be formed by the programming signal that results in a change in the programmed resistance of the memristor matrix layer 12 as measured between the first and second electrodes 14, 16. In general, the 'programmed resistance' is substantially an analog resistance (i.e., has a substantially continuous, analog resistance value between a maximum and minimum resistance value). In particular, the 'programmed resistance' may be programmed to exhibit substantially any resistance value between a maximum resistance and a minimum resistance of the memristor 10, by definition herein.

According to various examples, the first and second electrodes 14, 16 include a conductor. For example, the first electrode 14 and the second electrode 16 may include a conductive metal. The conductive metal used for the first and second electrodes 14, 16 may include, but is not limited to, gold (Au), silver (Ag), copper (Cu), aluminum (Al), palladium (Pd), platinum (Pt), tungsten (W), vanadium (V), tantalum (Ta), and titanium (Ti) as well as alloys thereof, for example. Other conductive metals and other conductive materials (e.g., a highly doped semiconductor, conductive oxides, conductive nitrides, etc.) may also be employed as the first electrode 14 and the second electrode 16, according to various examples. Moreover, the conductive material need not be the same in the first and second electrodes 14, 16.

Additionally, the first and second electrodes 14, 16 may include more than one layer. For example, a layer of Ti may be employed between a Pt-based electrode and a $TiO_2$ based memristor matrix layer 12. The Ti layer may assist in providing an oxygen deficient layer (i.e., $TiO_{2-x}$) in the $TiO_2$ oxide memristor matrix layer 12, for example. In still other examples, materials used in the electrodes 14, 16 may act as a diffusion barrier. For example, titanium nitride (TiN) may be employed as a diffusion barrier (e.g., to prevent material diffusion between the electrodes 14, 16 and the memristor matrix 12).

In some examples, a conductive material of one or both of the first electrode 14 and the second electrode 16 may include a metallic form or constituent of a metal oxide used as the memristor matrix layer 12. For example, a Ti metal may be employed in one or both of the electrodes 14, 16 when the memristor matrix layer 12 includes $TiO_2$. Similarly, one or both of the electrodes 14, 16 may include Ta when the memristor matrix layer 12 includes $Ta_2O_5$. In yet other examples, a refractory material such as tungsten may be used in the electrode(s) 14, 16.

According to various examples, the memristor 10 may provide 'storage' of the programmed resistance. In particular, the programmed resistance may be stored in a non-volatile manner by the memristor 10 by programming a particular resistance, according to some examples. For example, programming may establish a first programmed resistance of the memristor 10. After programming, the memristor 10 may be once again programmed (i.e., reprogrammed) to establish a second programmed resistance that is different from the first programmed resistance, for example. When not being programmed, the memristor 10 may substantially retain the programmed resistance (e.g., even in the absence of applied power).

The memristor 10 may be programmed by passing a current through the memristor 10, according to various examples. In particular, a particular programmed resistance may be programmed or set by application of an external signal referred to herein as a 'programming' signal. The programming signal may include one or both of a voltage and a current that is applied to the memristor 10. For example, the programming signal may be an applied voltage that induces the current through the memristor 10. By definition herein, a 'bipolar' memristor is a memristor in which a polarity of the programming signal (e.g., the applied voltage and, in turn, a direction of the current induced therein) dictates how the programmed resistance of the memristor is affected or changed by the programming signal. For example, a programming signal having a first polarity may increase the programmed resistance, while a programming signal having a second polarity may decrease the programmed resistance of the bipolar memristor. In other examples, the memristor may be 'unipolar' memristor in which a predetermined change in the programmed resistance occurs regardless of or substantially independent of a polarity of a programming signal, by definition herein. In particular, the unipolar memristor has substantially no bias polarity dependence and may be driven by heating or a change temperature, for example.

Herein, the term 'switched' when used as an adjective herein means 'switchable', and in some examples, means that a switch capable of having alternative ON and OFF states is included. For example, a 'switched memristor' includes a memristor and a switch, by definition herein. Similarly, the term 'tuned' when used as an adjective herein means 'tunable', and in some examples, means that a circuit or device includes a circuit element or structure that imparts tenability thereto. The term 'programmed' when used as an adjective herein means 'programmable,' as well.

Further, as used herein, the article 'a' is intended to have its ordinary meaning in the patent arts, namely 'one or more'. For example, 'a memristor' means one or more memristors and as such, 'the memristor' means 'the memristor(s)' herein. Also, any reference herein to 'top', 'bottom', 'upper', 'lower', 'up', 'down', 'front', 'back', 'left' or 'right' is not intended to be a limitation herein. Herein, the term 'about' when applied to a value generally means within the tolerance range of the equipment used to produce the value, or in some examples, means plus or minus 10%, or plus or minus 5%, or plus or minus 1%, unless otherwise expressly specified. Further, herein the term 'substantially' as used herein means a majority, or almost all, or all, or an amount within a range of about 51% to about 100%, for example. Moreover, examples herein are intended to be illustrative only and are presented for discussion purposes and not by way of limitation.

Figure 2:
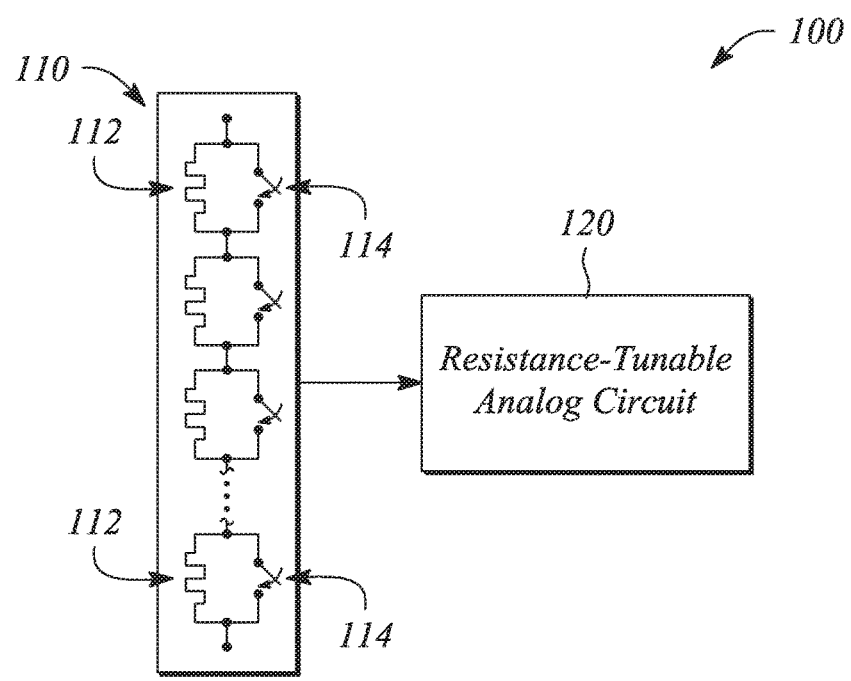
FIG. 2 illustrates a block diagram of a switched memristor tuned analog apparatus, according to an example consistent with the principles described herein.

FIG. 2 illustrates a block diagram of a switched memristor tuned analog apparatus 100, according to an example of the principles described herein. The switched memristor tuned analog apparatus 100 provides memristor-based tuning of an analog circuit. In various examples, the tuning is provided by a variable resistance of the switched memristor tuned analog apparatus 100. As such, the analog circuit is a 'resistance-tunable' analog circuit, according to various examples of the principles described herein.

The switched memristor tuned analog apparatus 100 illustrated in FIG. 2 includes a plurality of switched memristors 110. The switched memristors 110 are connected in series with one another and are configured to provide a switch-selectable programmed resistance, as is further described below. The series-connected switched memristors 110 of the plurality may be realized as or provided by a one-dimensional (1-D) array of switched memristors 110 (e.g., a switched memristor array), according to some examples. In particular, the series-connected switched memristors 110 of the plurality may be realized as a 'NAND' string' or a 'NAND-structured series' of switched memristors. The 'NAND' terminology is due to a similarity with a configuration of switches employed in a 'not-and' or NAND gate, for example.

According to various examples, a switched memristor 110 of the plurality includes a memristor 112 connected in parallel with a switch 114. The memristor 112 of the switched memristor 110 has a programmable resistance configured to provide a programmed resistance of the switch-selectable programmed resistance, according to various examples. In particular, a resistance of the memristor 112 may be programmed to an arbitrary resistance value between a maximum resistance and a minimum resistance of the memristor 112, according to various examples. As such, the 'programmed resistance' of the memristor 112 is an analog resistance that may be programmed (e.g., by a programming signal) into the memristor 112, by definition herein. Further by definition herein, the 'analog resistance' of memristor 112 may be an arbitrary resistance value as opposed to a particular resistance value chosen from among a plurality of predetermined or discrete resistance values as in a multi-level memristor memory, for example.

According to various examples, the memristor 112 is programmed by the application of a programming signal to the memristor 112. The programming signal may include one or both of a programming voltage applied to and a programming current flowing through the memristor 112, for example. Further, the programmed resistance is substantially maintained by the memristor 112 after being programmed, according to various examples. In particular, the memristor 112 may 'store' the programmed resistance in a substantially non-volatile manner in the absence of an applied power source (e.g., a voltage source, current source, etc.). Further, the programmed resistance is substantially maintained until the memristor 112 is reprogrammed by the application of another programming signal, according to various examples.

The switch 114, which is connected in parallel with the memristor 112, is configured to provide selection of the memristor 112 of the switched memristor 110. In particular, when the switch 114 is 'ON' or closed, the memristor 112 of the switched memristor 110 is substantially bypassed or 'removed from' the plurality of switched memristors 110. For example, an electric current flowing through the plurality of switched memristors 110 connected in series substantially flows through the closed switch 114 of the switched memristor 110 instead of through the bypassed memristor 112. As a result, the programmed resistance of the bypassed memristor 112 generally does not contribute in a substantial manner to a total resistance (i.e., the switch-selectable programmed resistance) of the plurality of switched memristors 110. On the other hand, when the switch 114 is 'OFF' or open, the memristor 112 connected in parallel with the switch 114 of the switched memristor 110 is not bypassed. As a result, the programmed resistance of the memristor 112 contributes to the total resistance of the plurality of series-connected switched memristors 110. In FIG. 2, all of the switches 114 of the switched memristors 110 are illustrated as OFF or open by way of example and not limitation. Further, curved arrows within the switches 114 in FIG. 2 illustrate that the switches 114 may be selectively turned ON or closed to bypass one or more of the memristors 112, for example.

In some examples, the switch 114 may be or include a solid-state switch such as, but not limited to, a field effect transistor (FET). For example, the switch 114 may include a FET with a source of the FET connected to a first terminal of the memristor 112 and a drain of the FET connected to a second terminal of the memristor 112. The FET may be an n-channel or a p-channel FET (e.g., an n-channel or a p-channel metal-oxide FET or MOSFET), according to some examples. The switch 114 that is or that includes a FET (e.g., an enhancement mode MOSFET) may be turned ON and OFF by appropriate application of a gate voltage $V_G$ to a gate of the FET. For example, a positive gate voltage $V_G$ may turn ON an n-channel FET when a gate-to-source voltage $V_{GS}$ exceeds a threshold voltage $V_T$ of the n-channel FET (e.g., the n-channel FET is ON for $V_G$ such that $V_{GS} > V_T$). Removal or reduction of the positive gate voltage $V_G$ such that the gate-to-source voltage $V_{GS}$ is less than the threshold voltage $V_T$ may cause the n-channel FET to turn OFF (e.g., the n-channel FET is OFF for $V_G$ such that $V_{GS} < V_T$). In another example using a different type of FET (e.g., a depletion mode MOSFET), application of the gate voltage $V_G$ may turn OFF the FET while removal of the gate voltage $V_G$ may turn ON the FET.

Figure 3A:
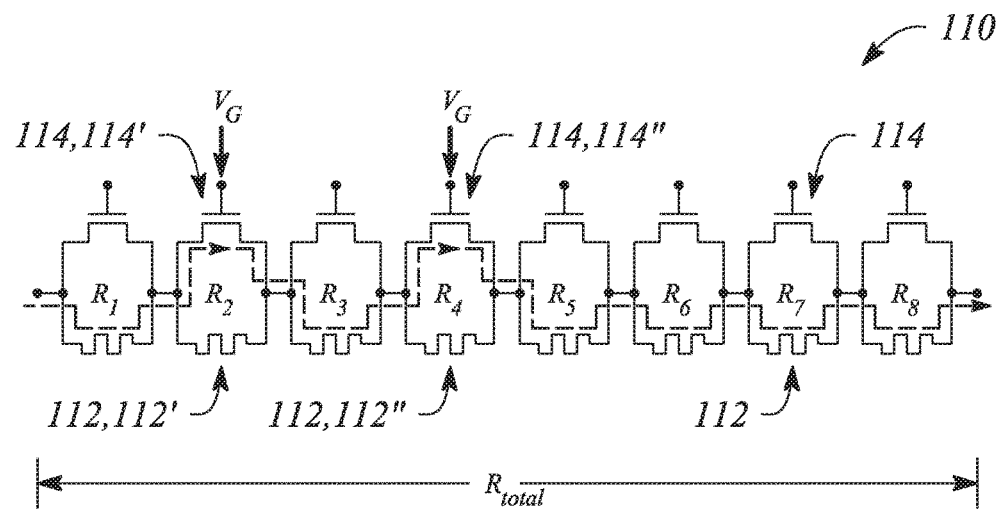
FIG. 3A illustrates a schematic diagram of a plurality of switched memristors connected in series, according to an example consistent with the principles described herein.

FIG. 3A illustrates a schematic diagram of a plurality of switched memristors 110 connected in series, according to an example consistent with the principles described herein.

The plurality of switched memristors 110 in FIG. 3A includes eight (8) individual memristors 112 and eight (8) parallel-connected switches 114 to make up eight (8) switched memristors 110, by way of example and not limitation. The eight (8) switches 114 of the eight (8) switched memristors 110 are FET switches, as illustrated. Further as illustrated, the eight (8) individual memristors 112 are programmed with eight (8) separate or distinct resistance values $R_1, R_2, \ldots, R_8$, respectively, wherein the separate resistance values may be different, or one or more may have the same value. Other than being between a maximum resistance value $R_{max}$ and a minimum resistance value $R_{min}$ of a respective individual memristor 112, each of the programmed resistance values $R_1, R_2, \ldots, R_8$ may be substantially any, arbitrarily chosen, analog value of resistance.

In FIG. 3A, a second switch 114' connected in parallel with a second memristor 112' having a programmed resistance value $R_2$ and a fourth switch 114'' connected in parallel with a fourth memristor 112'' having a programmed resistance value $R_4$ are both turned ON or closed. For example, the second and fourth switches 114', 114'' may be turned ON by application of a positive gate voltage $V_G$. As a result, the second and fourth memristors 112', 112'' are bypassed, as illustrated.

Since the second and fourth memristors 112', 112'' are bypassed, the programmed resistance values $R_2$ and $R_4$ do not contribute to a total resistance of the plurality of switched memristors 110 illustrated in FIG. 3A. In particular, the total resistance $R_{total}$ of the plurality of switched memristors 110 connected in series in FIG. 3A is equal to the sum of the programmed resistance values of the memristors 112 that are not bypassed (i.e., $R_{total}=R_1+R_3+R_5+R_6+R_7+R_8$). A dashed line with arrows in FIG. 3A illustrates an electric current path through the plurality of switched memristors 110 in FIG. 3A to emphasize that the second and fourth memristors 112', 112'' are bypassed due to the closure of the second and fourth switches 114', 114''. Note that if all of the switches 114 were turned OFF and none of the memristors 112 were bypassed (not illustrated), the total resistance $R_{total}$ would be a sum of all of the programmed resistances (i.e., $R_{total}=R_1+R_2+R_3+R_4+R_5+R_6+R_7+R_8$).

Figure 3B:
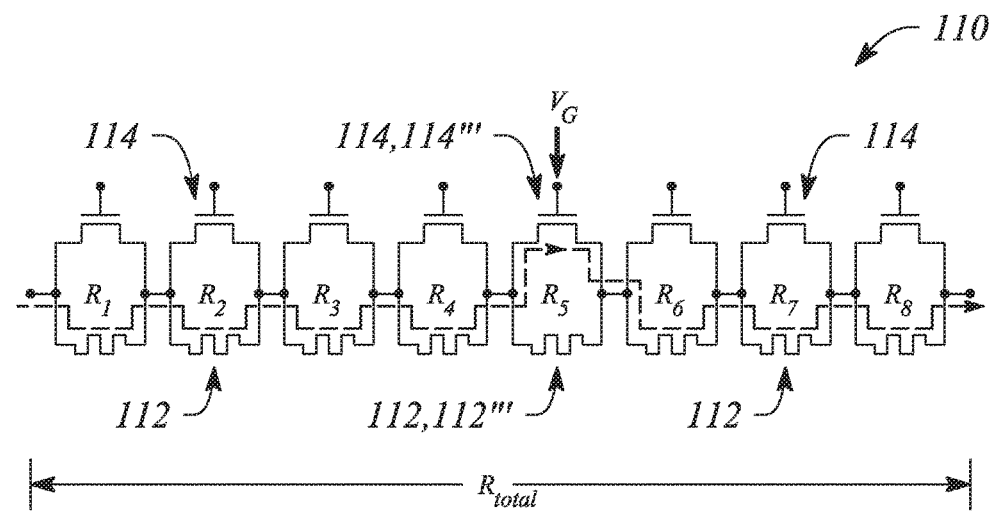
FIG. 3B illustrates a schematic diagram of the plurality of switched memristors of FIG. 3A, according to another example consistent with the principles described herein.

FIG. 3B illustrates a schematic diagram of the plurality of switched memristors 110 of FIG. 3A, according to another example consistent with the principles described herein. In particular, in FIG. 3B, only a fifth memristor 112''' is bypassed by a closed fifth switch 114'''. As illustrated in FIG. 3B, the total resistance $R_{total}$ is a sum of the programmed resistance of all of the memristors 114 except that of the fifth memristor 112''' (i.e., $R_{total}=R_1+R_2+R_3+R_4R_6+R_7+R_8$). Again, a dashed arrow illustrates an electric current path through the plurality of switched memristors 110 to emphasize the bypassing of the fifth memristor 112''' due to the closure of the fifth switch 114'''.

Also note that while programming the memristors 112 (e.g., as illustrated in FIGS. 3A and 3B) may be relatively slow, switching among the plurality of memristors 110 may be accomplished at a speed limited only by a switching or activation speed of the switches 114 (e.g., as opposed to a programming speed of the memristors 112). As such, transitioning from the total resistance $R_{total}$ or switch-selectable programmed resistance of the configuration in FIG. 3A to the total resistance $R_{total}$ or switch-selectable programmed resistance of the configuration in FIG. 3B may be accomplished very rapidly compared with reprogramming the programmable resistances of the individual memristors 112, for example. In particular, switching the switch-selectable programmed resistance between various resistance values provided by the programmed resistances of the eight (8) memristors 112 may be substantially limited only by the switching or activation speed of the switches 114 illustrated in FIGS. 3A and 3B. Therefore, the plurality of switched memristors 110 may provide rapid switching by switch selection.

On the other hand, since the memristor resistance values of the various memristors 112 of the plurality of switched memristors 110 may be programmed and reprogrammed to substantially any analog resistance value between the maximum and minimum resistance values $R_{max}, R_{min}$, the switch-selectable programmed resistance of the plurality of switched memristors 110 is generally not limited to combinations of available programmed resistances (e.g., $R_1, R_2, \ldots, R_8$), for example, when speed is not a limiting factor (e.g., programming and reprogramming is generally slower and in some examples much slower than the switching or activation speed of a switch).

Further, although not explicitly illustrated, it is possible to select a single memristor 112 of the plurality of switched memristors 110 by turning ON the switches 114 of all of the other memristors 112 that are not selected. As a result, all of the non-selected memristors 112 would be bypassed leaving only the selected memristor 112 to contribute to $R_{total}$. Selecting a single memristor 112 may allow programming the selected memristor 112, for example. In particular, a programming signal may be applied to the selected single memristor 112, according to various examples.

Referring again to FIG. 2, the switched memristor tuned analog apparatus 100 further includes a resistance-tunable analog circuit 120 connected to the plurality of switched memristors 110. The switch-selectable programmed resistance (e.g., total resistance $R_{total}$) of the plurality of switched memristors 110 is configured to tune an analog characteristic or attribute of the resistance-tunable analog circuit 120, according to various examples. In some examples, the resistance-tunable analog circuit 120 may be connected such that the resistance-tunable analog circuit 120 is tuned by or according to a voltage across the plurality of switched memristors 110, the voltage being proportional to the switch-selectable programmed resistance. In other examples, the resistance-tunable analog circuit 120 may be connected to be tuned by an electric current flowing through the plurality of switched memristors 110, wherein the electric current is proportional to the switch-selectable programmed resistance. In yet other examples, the resistance-turnable analog circuit 120 may be connected to be tuned directly by the switch-selectable programmed resistance.

According to various examples, the resistance-tunable analog circuit 120 may include, but is not limited to, one or more of an analog filter, an oscillator, an amplifier and an attenuator. When the resistance-tunable analog circuit 120 is or includes an analog filter, a frequency of the analog filter may be determined by the switch-selectable programmed resistance. For example, the analog filter may be a lowpass filter or highpass filter having a cut-off frequency determined by the switch-selectable programmed resistance. In another example, the analog filter may be a bandpass filter with a bandwidth of a passband that is determined by the switch-selectable programmed resistance. When the resistance-tunable analog circuit 120 is or includes an oscillator, a frequency of a signal produced by the oscillator may be a function of the switch-selectable programmed resistance, for example. When the resistance-tunable analog circuit 120 is or includes an amplifier, a gain of the amplifier may be determined by or be a function of the switch-selectable programmed resistance. Similarly, an attenuation of an attenuator may be set or determined by the switch-selectable programmed resistance, when the resistance-tunable analog circuit 120 is or includes an attenuator.

Figure 4A:
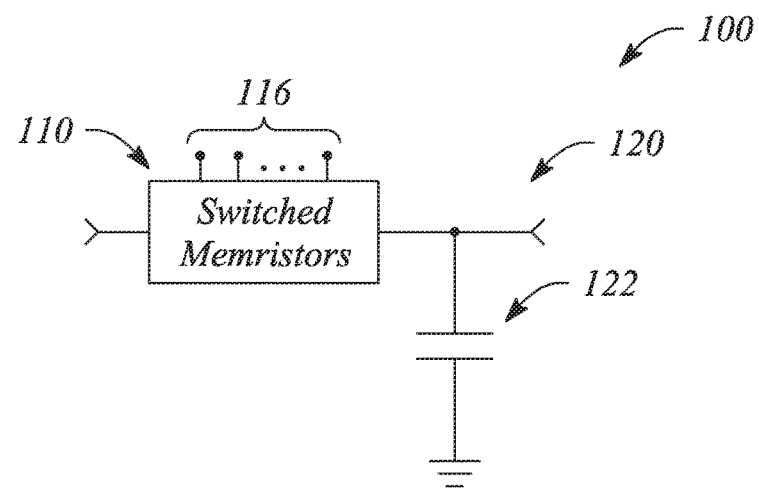
FIG. 4A illustrates a schematic diagram of a switched memristor tuned analog apparatus, according to an example consistent with the principles described herein.
Figure 4B:
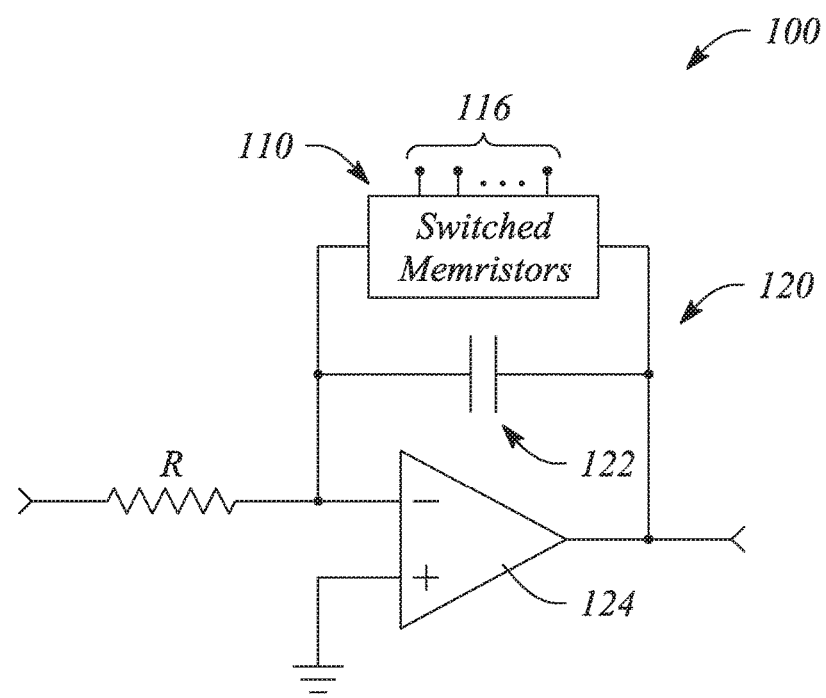
FIG. 4B illustrates a schematic diagram of a switched memristor tuned analog apparatus, according to another example consistent with the principles described herein.
Figure 4C:
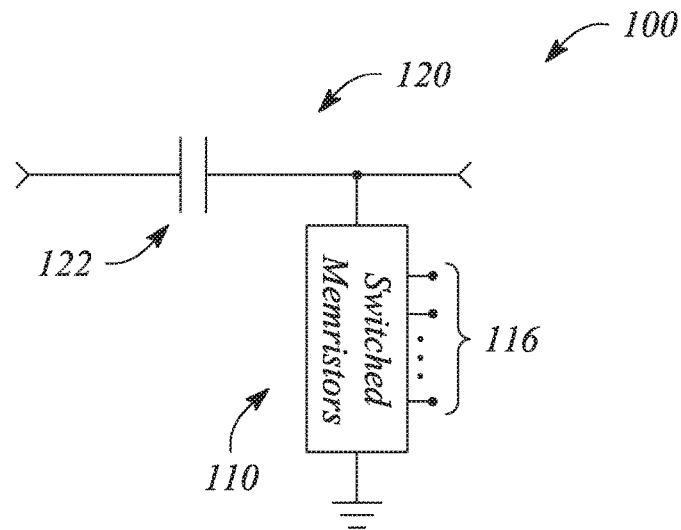
FIG. 4C illustrates a schematic diagram of a switched memristor tuned analog apparatus, according to yet another example consistent with the principles described herein.

FIG. 4A illustrates a schematic diagram of a switched memristor tuned analog apparatus 100, according to an example consistent with the principles described herein. FIG. 4B illustrates a schematic diagram of a switched memristor tuned analog apparatus 100, according to another example consistent with the principles described herein. FIG. 4C illustrates a schematic diagram of a switched memristor tuned analog apparatus 100, according to yet another example consistent with the principles described herein. The switched memristor tuned analog apparatuses 100 of FIGS. 4A-4C (as well as FIGS. 5-6, described below) may be specific, non-limiting examples of the switched memristor tuned analog apparatus 100 of FIG. 2, for example. In particular, the switched memristor tuned analog apparatus 100 of FIGS. 4A-4C includes a plurality of switched memristors 110 and a resistance-tunable analog circuit 120 arranged as or representing an analog filter, by way of example. More particularly, the analog filter illustrated in FIGS. 4A and 4B is representative of a lowpass filter, while the analog filter illustrated in FIG. 4C is representative of a highpass filter. A frequency of the analog filter (e.g., a cut-off frequency) is determined or tuned by the switch-selectable programmed resistance of the plurality of switched memristors 110, according to various examples.

The plurality of switched memristors 110 may be arranged as illustrated in FIGS. 3A-3B, according to some examples. In addition, the plurality of switched memristors 110 may include a plurality of selection inputs 116 to facilitate selection of the switched memristors 110. For example, the selection inputs 116 may correspond to or be connected to gate inputs of the various FET switches 114 illustrated in FIGS. 3A-3B. Selection of a particular switched memristor 110 may be provided by applying a selection signal (e.g., a gate voltage $V_G$) to a corresponding selection input 116 of the plurality, for example.

As illustrated in FIGS. 4A and 4B, the analog filter includes a capacitor 122 connected to the plurality of switched memristors 110 to form the lowpass filter. In FIG. 4A, the capacitor 122 is connected directly to the plurality of switched memristors 110 to form a simple, passive resistance-capacitance (RC) lowpass filter. The analog filter illustrated in FIG. 4B includes the capacitor 122 and the plurality of switched memristor 110 connected to an operational amplifier 124 and a resistor R to form the lowpass filter. In FIG. 4C, analog filter includes a capacitor 122 that is connected directly to the plurality of switched memristors 110 to form a simple, passive RC highpass filter.

In each of FIGS. 4A-4C, a cut-off frequency or equivalently, a bandwidth, of the analog filter is a function of and thus tunable by the switch-selectable programmed resistance of the plurality of switched memristors 110. In particular, the cut-off frequency may be varied or tuned rapidly by switch selection among available ones of the programmed resistance values of the plurality of switched memristors 110 using the switches thereof. For example, the cut-off frequency $f_c$ of the lowpass and highpass filters illustrated in FIG. 4A-4C may be given by equation (1) as $$f_c = \frac{1}{2\pi C \cdot R_{total}} \quad (1)$$

where $R_{total}$ is an the switch-selectable programmed resistance of the plurality of switched memristors 110 (e.g., $R_{total}$) and C is the capacitance of the capacitor 122. Thus, the analog filter in the switched memristor tuned apparatus 100 of FIGS. 4A-4C may be a fast-reconfigurable analog filter, according to various examples. Further, the cut-off frequency or bandwidth of the analog filter also may be varied, albeit much more slowly, by reprogramming the programmed resistance values of the plurality of switched memristors 110.

Note that the simple analog filters illustrated herein are meant to be representative of a wide variety of tunable analog filters that may be implemented as the resistance-tunable analog circuit 120 tuned by the switch-selectable programmed resistance of the plurality of switched memristors 110, according to various examples of the principles described herein. For example, while illustrated as a lowpass filter, the resistance-tunable analog circuit 120 of FIG. 4B may be rearranged (e.g., by changing a location of the capacitor 122) to implement a highpass filter (not illustrated). Further, a cascade of a plurality of highpass filters and lowpass filters implemented with the plurality of switched memristors 110 may provide an analog filter that is a bandpass filter (not illustrated) having a resistance-tunable bandwidth, according to some examples.

Figure 5:
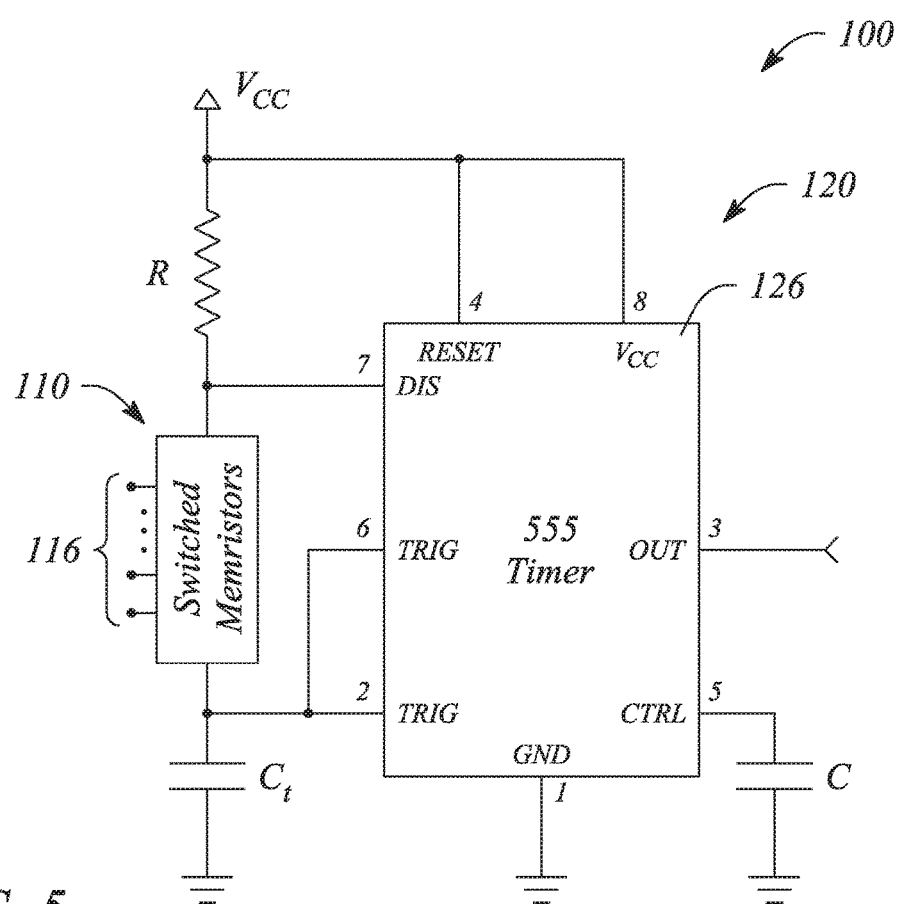
FIG. 5 illustrates a schematic diagram of a switched memristor tuned analog apparatus, according to another example consistent with the principles described herein.

FIG. 5 illustrates a schematic diagram of a switched memristor tuned analog apparatus 100, according to another example consistent with the principles described herein. In particular, FIG. 5 illustrates the resistance-tunable analog circuit 120 as an oscillator 120, in this example. The oscillator 120 includes a so-called '555-timer' (e.g., LM-555) or a similar device 126 connected to the plurality of switched memristors 110, a resistor R, a timing capacitor $C_t$, and another capacitor C, and a power supply voltage $V_{CC}$ to form a resistance-controlled or resistance-tuned oscillator 120 (e.g., a 555-timer configured in an astable mode). The resistance-tuned oscillator including the 555-timer has an output frequency $f_{out}$ that is determined by the switch-selectable programmed resistance (e.g., $R_{total}$) of the plurality of switched memristors 110 (e.g., as controlled by selection inputs 116). For example, the output frequency $f_{out}$ may be as in equation (2)

$$f_{out} = \frac{1}{\ln(r) \cdot C_t \cdot (R + 2R_{total})} \quad (2)$$

where 'ln(2)' is the natural logarithm of 2. According to equation (2), changing the switch-selectable programmed resistance $R_{total}$ using either switch selection among the programmed resistance values of the plurality of switched memristors 110, as described above, or by reprogramming one or more of the memristors of the plurality of switched memristors 110 allows the output frequency $f_{out}$ to be tuned or varied.

Figure 6:
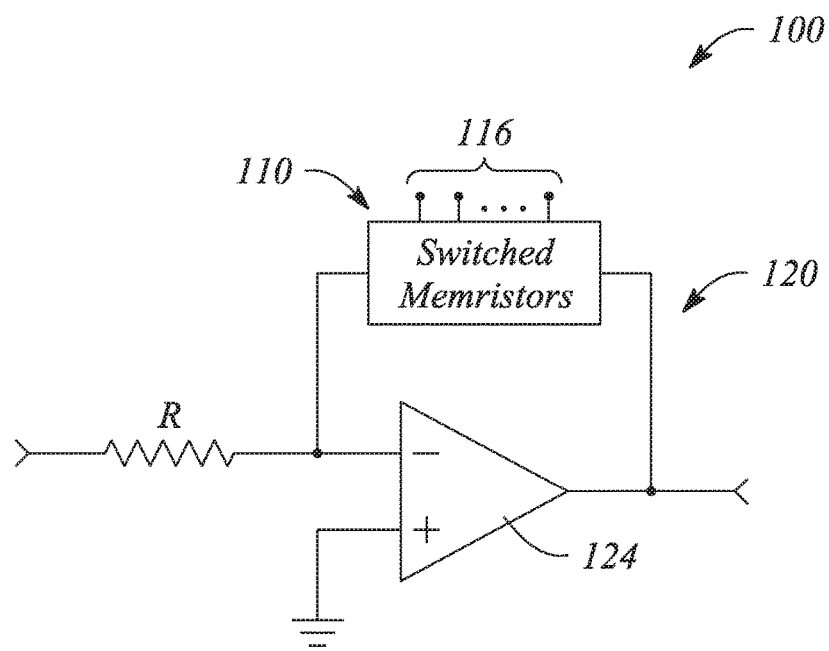
FIG. 6 illustrates a schematic diagram of a switched memristor analog apparatus, according to another example consistent with the principles described herein.

FIG. 6 illustrates a schematic diagram of a switched memristor analog apparatus 100, according to another example consistent with the principles described herein. In particular, FIG. 6 illustrates the resistance-tunable analog circuit 120 as an amplifier (i.e., an inverting amplifier) with the plurality of switched memristors 110 connected to adjust or tune a gain of the amplifier. As illustrated, the amplifier includes an operational amplifier 124 with a resistor R connected to a negative input of the operational amplifier 124. The plurality of switched memristors 110 is connected between an output of the operational amplifier 124 and the negative input thereof, while a positive input of the operational amplifier 124 is connected to a ground potential, as illustrated. The gain of the amplifier (i.e., voltage gain) is a function of a ratio of the switch-selectable programmed resistance of the plurality of memristors 110 and a resistance of the resistor R. For example, the voltage gain G of the amplifier illustrated in FIG. 6 may be given by equation (3) as $$G = -\frac{R_{total}}{R} \qquad (3)$$

where $R_{total}$ is the switch-selectable programmed resistance. As is evident from equation (3), the voltage gain of the amplifier may be tuned or adjusted by changing the switch-selectable programmed resistance $R_{total}$. A variety of similar adjustable gain amplifiers (not illustrated) may be implemented by switching a location of the resistor R and the plurality of memristors 110 with respect to one another and with respect to the positive and negative inputs of the operational amplifier without departing from the scope described herein.

Figure 7:
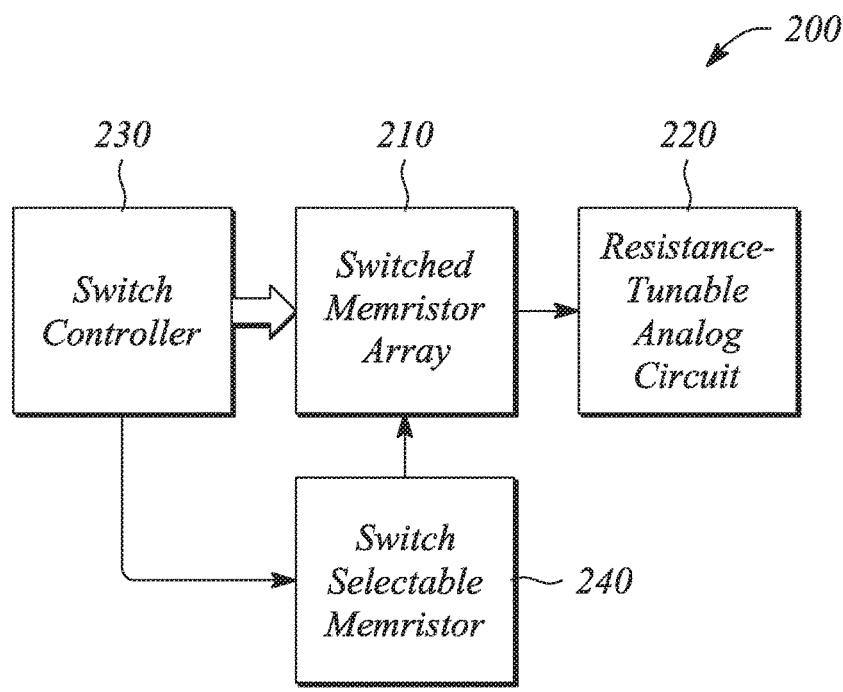
FIG. 7 illustrates a block diagram of a switched memristor analog system, according to an example of the principles described herein.

In some examples, a switched memristor analog system is provided. FIG. 7 illustrates a block diagram of a switched memristor analog system 200, according to an example consistent with the principles described herein. The switched memristor analog system 200 includes a switched memristor array 210. The switched memristor array 210 includes a plurality of switch selectable memristors. The switched memristor array 210 is configured to provide a switch-selectable programmable resistance. According to various examples, the switch-selectable programmable resistance may be provided by one or both of switch selection of a switch selectable memristor of the plurality and a programmable resistance of the selected switch selectable memristor. In some examples, the plurality of switch selectable memristors of the switched memristor array 210 as well as individual switch selectable memristors thereof may be substantially similar respectively to the plurality of switched memristors 110 and individual switched memristors 110 of the plurality, described above with respect to the switched memristor tuned analog apparatus 100.

In particular, in some examples, the switched memristor array 210 includes the plurality of switch selectable memristors connected in series. In some examples, a switch selectable memristor includes a field effect transistor (FET) connected in parallel with the memristor. A source of the FET may be connected to a first terminal of the memristor and a drain of the FET may be connected to a second terminal of the memristor, for example. The FET may serve as a switch to provide switch selection of the parallel-connected memristor, according to various examples. In other examples, a switch selectable memristor of the switched memristor array 210 may include another type of switch, other than the FET, connected in parallel with the memristor from the first terminal to the second terminal thereof, to provide switch selection of the memristor. The other type of switch may include, but is not limited to, another type of transistor switch and even a non transistor-based switch (e.g., microelectromechanical system (MEMS) switch), for example.

As illustrated in FIG. 7, the switched memristor analog system 200 further includes a resistance-tunable analog circuit 220. The switch-selectable programmable resistance of the switched memristor array 210 is configured to tune an analog attribute of the resistance-tunable analog circuit 220, according to various examples. In some examples, the resistance-tunable analog circuit 220 is substantially similar to the above-described resistance-tunable analog circuit 120 of the switched memristor tuned analog apparatus 100. In particular, the resistance-tuned analog circuit 220 may include one or more of an analog filter (e.g., lowpass filter, highpass filter, bandpass filter, etc.), an amplifier, an attenuator and an oscillator that are tunable according to the switch-selectable programmable resistance of the switched memristor array 210, for example.

Further, as illustrated in FIG. 7, the switched memristor analog system 200 includes a switch controller 230. According to various examples, the switch controller 230 is configured to provide selection of the switch selectable memristors of the switched memristor array 210. Further, the switch-selectable programmable resistance is provided by one or both of switch selection of a switch selectable memristor of the plurality (e.g., under control of the switch controller 230) and a programmable resistance of the selected switch selectable memristor, according to various examples.

In some examples (e.g., as illustrated in FIG. 7), the switched memristor analog system 200 may further include another switch selectable memristor 240. According to some examples, the other switch selectable memristor 240 is substantially similar to a switch selectable memristor of the switched memristor array 210. Further, the other switch selectable memristor 240 is connected to the switched memristor array 210, according to various examples. For example, the other switch selectable memristor 240 may be connected in series with the switched memristor array 210. In some examples, the switch controller 230 may be configured to also provide selection of the other switch selectable memristor 240 in addition to selection of switch selectable memristors of the switched memristor array 210. The other switch selectable memristor 240 may be configured to serve as a spare in the event of a failure of a switch selectable memristor of the switched memristor array 210, according to some examples.

For example, a particular switch selectable memristor of the switched memristor array 210 may fail. A switch of the switch selectable memristor may be set to bypass the failed memristor by the switch controller 230. In turn, the other switch selectable memristor 240 may be programmed to have a programmed resistance that is about equal to the programmed resistance of the failed switch selectable memristor. The other switch selectable memristor 240 may then be used in place of the failed switch selectable memristor by the action of the switch controller 230. In particular, the other switch selectable memristor 240 may contribute to the switch-selectable programmable resistance of the switched memristor array 210 as if it was part of the switched memristor array 210. Further, the switch controller 230 may select the other switch selectable memristor 240 as if it belonged to the switched memristor array 210. In other words, the other switch selectable memristor 240 serves as a spare to replace the failed switch selectable memristor.

Figure 8:
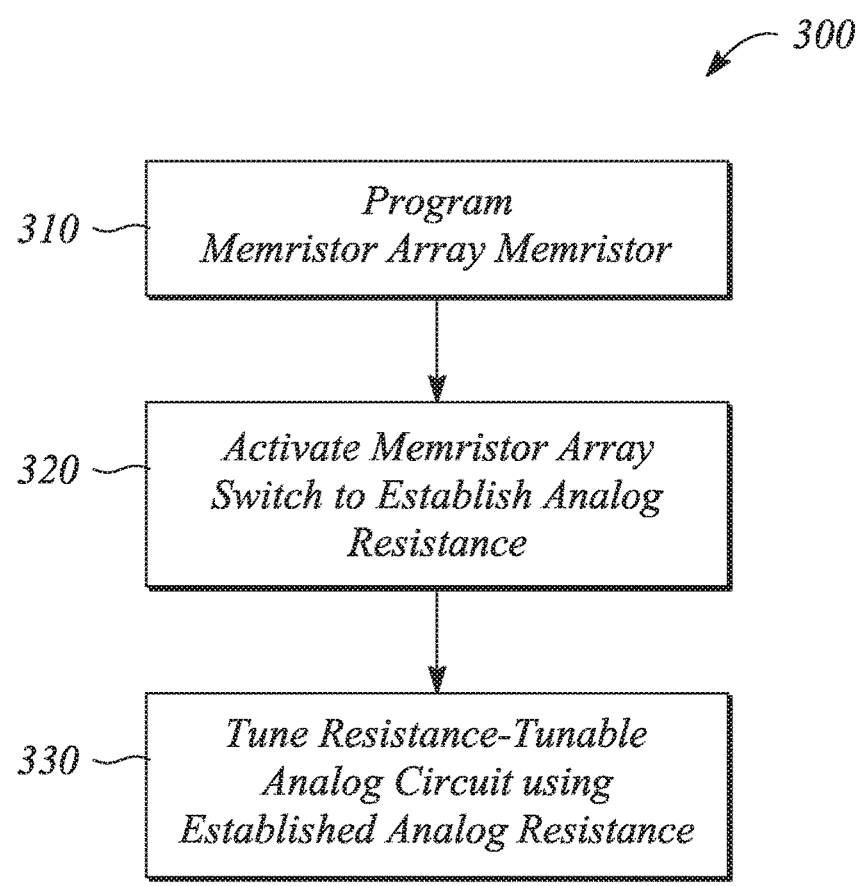
FIG. 8 illustrates a flow chart of a method of analog apparatus tuning using a switched memristor array, according to an example consistent with the principles described herein.

In some examples, a method of analog tuning is provided. FIG. 8 illustrates a flow chart of a method 300 of analog tuning using a memristor array that includes memristors and switches connected to the memristors, according to an example consistent with the principles described herein. As illustrated, the method 300 of analog tuning includes programming 310 a memristor of the memristor array. Programming 310 a memristor includes applying a programming signal to the memristor, for example. According to some examples, the memristor array may be substantially similar to either the plurality of switched memristors 110 (i.e., memristors 112 and switches 114) of the switched memristor tuned analog apparatus 100 or the switched memristor array 210 of the switched memristor analog system 200, described above.

Further, as illustrated, the method 300 of analog tuning includes switching or activating 320 a switch of the memristor array. Activating 320 the switch selects a programmed 310 memristor of the memristor array and establishes an analog resistance of the memristor array. For example, activating 320 a switch may turn ON the switch to bypass the selected programmed 310 memristor. In other examples, activating 320 a switch turns OFF the switch to enable the selected programmed 310 memristor to contribute a programmed resistance to, and thus establish, the analog resistance of the memristor array. One or more of the switches of the memristor array may include a field effect transistor (FET) connected in parallel with corresponding one or more programmed memristors. A source of the FET may be connected to a first terminal of the memristor and a drain of the FET may be connected to a second terminal of the memristor, for example. Activating 320 a switch may include turning OFF the FET by removing a bias voltage from a gate of the FET and turning ON the FET by applying the gate bias voltage, for example.

According to various examples, the method 300 of analog tuning further includes tuning 330 a resistance-tunable analog circuit using the established analog resistance of the memristor array. According to some examples, the resistance-tunable analog circuit that is tuned 330 may be substantially similar to the resistance-tunable analog circuit 120 described above with respect to the switched memristor tuned analog apparatus 100. In particular, the resistance-tuned analog circuit may include, but is not limited to, one or more of an analog filter, an amplifier, an attenuator and an oscillator, according to various examples.

Thus, there have been described examples of a switched memristor tuned analog apparatus, a switched memristor analog system and a method of analog tuning using a switched memristor array, each of which employ a switch-selectable programmed resistance to tune a resistance-tunable analog circuit. It should be understood that the above-described examples are merely illustrative of some of the many specific examples that represent the principles described herein. Clearly, those skilled in the art can readily devise numerous other arrangements without departing from the scope as defined by the following claims.

What is claimed is:

1. A switched memristor tuned analog apparatus, comprising:
   a plurality of switched memristors connected in series to provide a switch-selectable programmed resistance, a switched memristor of the plurality comprising a memristor connected in parallel with a switch, the switch to select the memristor, the memristor having a programmable analog resistance to provide a programmed resistance of the switch-selectable programmed resistance;
   a resistance-tunable analog circuit connected to the plurality of switched memristors, the switch-selectable programmed resistance of the plurality of switched memristors to provide rapid memristor-based tuning of an analog attribute of the resistance-tunable analog circuit; and
   another switched memristor connected in series with the plurality of switched memristors, the other switched memristor to serve as a spare in event of a failure of a switched memristor of the plurality of switched memristors.

2. The switched memristor tuned analog apparatus of claim 1, wherein the switch of the switched memristor comprises a field effect transistor (FET) with a source of the FET connected to a first terminal of the memristor and a drain of the FET connected to a second terminal of the memristor.

3. The switched memristor tuned analog apparatus of claim 1, wherein the switch-selectable programmed resistance is to be changed to tune the resistance-tunable analog circuit one or both of by programming the programmable analog resistance of the memristor and by activating the switch of the switched memristor.

4. The switched memristor tuned analog apparatus of claim 1, wherein the resistance-tunable analog circuit comprises an analog filter, the analog attribute being a frequency characteristic of the analog filter determined by the switch-selectable programmed resistance.

5. The switched memristor tuned analog apparatus of claim 4, wherein the analog filter comprises a capacitor connected to the plurality of switched memristors.

6. The switched memristor tuned analog apparatus of claim 1, wherein the resistance-tunable analog circuit comprises an oscillator, a frequency of the oscillator to be determined by the switch-selectable programmed resistance.

7. The switched memristor tuned analog apparatus of claim 1, wherein the resistance-tunable analog circuit comprises an amplifier, a gain of the amplifier to be determined by the switch-selectable programmed resistance.

8. A switched memristor analog system comprising:
   a switched memristor array comprising a plurality of switch selectable memristors, the switched memristor array to provide a switch-selectable programmable resistance;
   a resistance-tunable analog circuit, the switch-selectable programmable resistance of the switched memristor array to provide rapid memristor-based tuning of an analog attribute of the resistance-tunable analog circuit;
   a switch controller to provide selection of one or more of the switch selectable memristors of the switched memristor array,
      wherein the switch-selectable programmable resistance is provided by both switch selection of a switch selectable memristor of the array and a programmable resistance of the selected switch selectable memristor; and
   another switch selectable memristor connected to the switched memristor array, the other switch selectable memristor to serve as a spare in event of a failure of the switch selectable memristor of the switched memristor array.

9. The switched memristor analog system of claim 8, wherein the switch selectable memristors of the array are connected in series, the switch selectable memristor comprising a field effect transistor (FET) connected in parallel with a memristor with a source of the FET being connected to a first terminal of the memristor and a drain of the FET being connected to a second terminal of the memristor.

10. The switched memristor analog system of claim 8, wherein the resistance-tunable analog circuit comprises one or more of an analog filter, an amplifier, and an oscillator.

11. A method of analog tuning using a switched memristor array, the method comprising:
  programming a memristor of a switched memristor array;
  activating a switch of the switched memristor array to select the programmed memristor and to establish an analog resistance of the switched memristor array;
  providing rapid memristor-based tuning of a resistance-tunable analog circuit using the established analog resistance; and
  providing another switch selectable memristor connected to the switched memristor array, the other switch selectable memristor to serve as a spare in event of a failure of the switch selectable memristor of the switched memristor array.

12. The method of analog tuning of claim 11, wherein a switched memristor of the switched memristor array comprises a switch connected in parallel with the memristor, the switch comprising a field effect transistor (FET).

13. The method of analog apparatus tuning of claim 11, wherein the resistance-tunable analog circuit comprises one or more of an analog filter, an amplifier, an attenuator and an oscillator.

* * * * *